US005781881A

United States Patent [19]

Stegmann

[11] Patent Number: 5,781,881

[45] Date of Patent: Jul. 14, 1998

[54] VARIABLE-SUBFRAME-LENGTH SPEECH-CODING CLASSES DERIVED FROM WAVELET-TRANSFORM PARAMETERS

[75] Inventor: Joachim Stegmann, Darmstadt, Germany

[73] Assignee: Deutsche Telekom AG, Bonn, Germany

[21] Appl. No.: 734,657

[22] Filed: Oct. 21, 1996

[30] Foreign Application Priority Data

Oct. 19, 1995 [DE] Germany ........................ 195 38 852.6

[51] Int. Cl.$^{6}$ ................................ G10L 7/02; H03M 7/30

[52] U.S. Cl. ............................................ 704/211; 704/214

[58] Field of Search ...................................... 704/211, 214

[56] References Cited

U.S. PATENT DOCUMENTS

| | | | |
|---|---|---|---|
| 5,490,170 | 2/1996 | Akagiri et al. | 704/501 |
| 5,495,555 | 2/1996 | Swaminathan | 704/207 |
| 5,596,676 | 1/1997 | Swaminathan et al. | 704/208 |

FOREIGN PATENT DOCUMENTS

| | | |
|---|---|---|
| 0 519 802 | 12/1992 | European Pat. Off. . |
| 42 03 436 | 8/1992 | Germany . |
| 42 37 563 | 5/1993 | Germany . |
| 43 15 313 | 11/1994 | Germany . |
| 43 15 315 | 11/1994 | Germany . |
| 43 40 591 | 11/1994 | Germany . |
| 44 37 790 | 1/1995 | Germany . |
| 44 40 838 | 5/1995 | Germany . |
| 44 27 656 | 11/1995 | Germany . |
| 195 05 435 C1 | 12/1995 | Germany . |
| 2 272 554 | 5/1994 | United Kingdom . |

OTHER PUBLICATIONS

Olivier Rioul and Martin Vetterli, "Wavelets and Signal Processing," IEEE Signal Processing Magazine, vol. 8, No. 4, pp. 14–38, Oct. 1991.

Stephane G. Mallat and Sifen Zhong, "Characterization of Signals from Multiscale Edges," IEEE Trans. Pattern Analysis and Machine Intelligence, vol. 14, No. 7, pp. 710–732, Jul. 1992.

Shubha Kadambe and G. Faye Bourdeaux–Bartels, "Application of the Wavelet Transform for Pitch Detection of Speech Signals," IEEE Trans. Information Theory, vol. 38, No. 2, pp. 917–924, Mar. 1992.

Joachim Stegmann, Gerhard Schroder, and Kyrill A. Fischer "Robust Classification of Speech Based on the Dyadic Wavelet Transform with Application to CELP Coding,"Proc. ICASSP 96, pp. 546–549, May, 1996.

*Primary Examiner*—David R. Hudspeth
*Assistant Examiner*—Tālivaldis Ivars Šmits
*Attorney, Agent, or Firm*—Kenyon & Kenyon

[57] ABSTRACT

A method and a device are described for classifying speech on the basis of the wavelet transformation for low-bit-rate speech coding processes. The method and the device permit a more robust classifier of speech signals for signal-matched control of speech coding processes in order to reduce the bit rate without affecting the speech quality or to increase the quality at the same bit rate. The method provides that, after segmenting the speech signal, a wavelet transformation is calculated for each frame, from which a set of parameters is determined with the help of adaptive thresholds. The parameters control a finite-state model, which subdivides the frames into shorter subframes if required, and classifies each subframe into one of several classes typical for speech coding. The speech signal is classified on the basis of the wavelet transformation for each time frame. Thus both a high time resolution (location of pulses) and frequency resolution (good mean values) can be achieved. This method and the classifier are therefore especially well suited for the control and selection of code books in a low-bit-rate speech coder. They also have a low sensitivity to background noise and low complexity.

11 Claims, 3 Drawing Sheets

VARIABLE-SUBFRAME-LENGTH SPEECH-CODING CLASSES DERIVED FROM WAVELET-TRANSFORM PARAMETERS

FIELD OF THE INVENTION

The invention concerns a method for classifying speech signals, as well as a circuit arrangement for executing the method.

Related Technology

Speech coding processes and corresponding circuit arrangements for classifying speech signals for bit rates under 8 kbit per second are becoming increasingly important.

The main applications for such processes and devices include multiplex transmissions for existing non-switched networks and third-generation mobile telephone systems. Speech coding processes in this data rate range are also needed for providing services such as video telephony.

Most currently known high-quality speech coding processes for data rates between 4 kbs and 8 kbs work by the principle of the Code Excited Linear Prediction (CELP) process as first described by Schroeder, M. R., Atal, B. S.: Code-Excited Linear Prediction (CELP): High Quality Speech at Very Low Bit Rates, in Proceedings of IEEE International Conference on Acoustics, Speech, and Signal Processing, 1985. According to this process, the speech signal is synthesized by linear filtering of excitation vectors from one or more code books. In a first step, the coefficients of the short-term synthesis filter are obtained by LPC analysis from the input speech vector and then quantised. Subsequently the excitation code books are searched, and the perceptually weighted errors between original and synthesized speech vector are used as the optimum criterion (=analysis by synthesis). Finally, only the indices of the optimum vectors, from which the decoder can reproduce the synthesized speech vector, are transmitted.

Many of these coding processes, such as the new 8 kbps speech coder of ITU-T, described in the publication Study Group 15 Contribution—Q. 12/15: Draft Recommendation G.729—Coding of Speech at 8 kbps using Conjugate-Structure-Algebraic-Code-Excited-Linear-Predictive (CS-ACELP) Coding, 1995, work with a fixed combination of code books. This rigid arrangement does not take into consideration the considerable variations in the speech signal characteristics over time and, on the average, uses more bits for coding than necessary. For example, the adaptive code book required only for coding periodic speech segments remains on line even during clearly non-periodic segments.

In order to arrive at lower data rates in the 4 As range with as little deterioration in quality as possible, it was proposed in other publications, for example in Wang, S., Gersho, A.: Phonetically-Based Vector Excitation Coding of Speech at 3.6 kbps, Proceedings of IEEE International Conference on Acoustics, Speech and Signal Processing, 1989, that the speech signal should be classified in different categories prior to coding. In the proposal for the GSM half-rate system, the signal is divided into voiced and unvoiced segments on a frame-by-frame basis (20 ms ) using the open-loop long-form prediction gain whereby the data rate for excitation is reduced and quality remains basically unchanged compared to the full-rate system. In a more general study, the signal was divided into voiced, voiceless and onset. The decision was obtained by frame (every 11.25 ms here) on the basis of parameters such as frequency of passage through zero, reflection coefficients, and power, among others, through linear discrimination; see, for example, Campbell, J., Tremain, T.: Voiced/Unvoiced Classification of Speech with Application to the U.S. Government LPC-10*e* Algorithm, Proceedings of IEEE International Conference on Acoustics, Speech and Signal Processing, 1986. A certain combination of code books is then assigned to each class, so that the data rate can be reduced to 3.6 kbs with medium quality.

All these processes produce the result of their classification from parameters obtained by calculation of time averages from a constant-length window. The time resolution is thus determined by selection of this window length. If the window length is reduced, the accuracy of the average is also reduced. On the other hand, if the window length is enlarged, the variation of the average over time can no longer follow the variation of the nonstationary speech signal. This is especially true for highly nonstationary transitions (onsets) from voiceless to voiced speech segments. The correct reproduction in time of the position of the first significant pulse of voiced segments is, however, important for the subjective evaluation of a coding process. Other disadvantages of the conventional classification process often include a high degree of complexity or strong dependence on background noise that is always present in real life.

SUMMARY OF THE PRESENT INVENTION

The object of the present invention is to provide a method and a speech signal classifier for signal-matched control of speech coding processes in order to reduce the bit rate without affecting speech quality or to increase the quality at an unchanged bit rate, which would classify the speech signal with the help of the wavelet transformation for each period, achieving high resolution in both time and frequency at the same time.

The method of the present invention therefore provides for classification of speech, specifically speech signals for signal-matched control of speech coding processes to reduce the bit rate without affecting speech quality or to increase quality at the same bit rate, such that after segmenting the speech signal for each frame formed, a wavelet transformation is calculated, from which a set of parameters ($P_1$–$P_3$) is obtained with the help of adaptive thresholds. The parameters control a finite-state model that divides the speech frames into subframes and classifies each of these subframes into one of several classes typical for speech coding.

The present invention also provides a classifier for carrying out the abovedescribed method in which the input speech is supplied to a segmentator, that after segmenting the input speech, a discrete wavelet transformation is calculated by a processor for each frame or segment formed. A set of parameters ($P_1$–$P_3$) is determined with the help of adaptive thresholds, which parameters are supplied as inputs to a finite-state model, which in turn divides the speech frames into subframes and classifies each of these subframes into one of several classes typical for speech coding.

In addition to the above-described method, the speech signal may be divided into constant-length segments or frames, and, in order to avoid edge effects in the subsequent wavelet transformation, either the segment is mirrored at the boundaries, or the wavelet transformation is calculated in smaller intervals (L/2, N-L/2), and the frame is shifted by the constant offset (L/2) only, so that the segments overlap or that the edges of the segments are filled with previous or future sampling values.

For a segment s(k), a discrete-time wavelet transformation (DWT) $S_h(m, n)$ may be calculated in reference to a wavelet h(k) with the integer scaling (m) and time shift (n) parameters, and the segment may be subdivided into classes on the basis of the transformation coefficients, specifically to achieve a finer time resolution, into P subframes, and for each subframe a classification result may be calculated and output.

Moreover, a set of parameters, specifically scaling difference ($P_1$), time difference ($P_2$), and periodicity ($P_3$) parameters, may be determined from the transformation coefficients $S_h(m, n)$, and with the help of these parameters the final classification may then be performed, and the threshold values required for these parameter calculations may be adaptively controlled according to the current level of the background noise.

Here we shall describe a method and an arrangement that classify the speech signal on the basis of the wavelet transformation for each time frame. Thus both a high time resolution (location of pulses) and frequency resolution (good averages) can be achieved. Therefore the classification is especially well-suited for the control and selection of code books in a low-bit-rate speech coder. The method and the arrangement exhibit low sensitivity to background noise and low complexity. The wavelet transformation, like the Fourier transformation, is a mathematical procedure for constructing a model for a signal or a system. Contrary to the Fourier transformation, however, the time, frequency, and scaling range resolution can be adapted to the requirements in a flexible manner. The basic functions of the wavelet transformation are obtained by scaling and shifting from a "mother wavelet" and have a band pass character. Therefore the wavelet transformation is uniquely defined only when the corresponding mother wavelet is given. Background and details of the mathematical theory are described, for example, in Rioul O., Vetterli, M.: Wavelets and Signal Processing, IEEE Signal Processing Magazine, Oct. 1991.

Due to its properties, the wavelet transformation is well-suited for analyzing nonstationary signals. Another advantage is the existence of fast algorithms allowing effective calculation of the wavelet transformation. Successful signal processing applications include image coding, broad-band correlation procedures (e.g., for radar), as well as for fundamental frequency estimation in speech processing as described in the following publications, among others: Mallat, S., Zhong, S.: Characterization of Signals from Multiscale Edges, IEEE Transactions on Pattern Analysis and Machine Intelligence, July 1992, and Kadambe, S. Boudreaux-Bartels, G. F.: Applications of the Wavelet Transform for Pitch Detection of Speech Signals, IEEE Transactions on Information Theory, March 1992.

DETAILED DESCRIPTION

Figure 1:
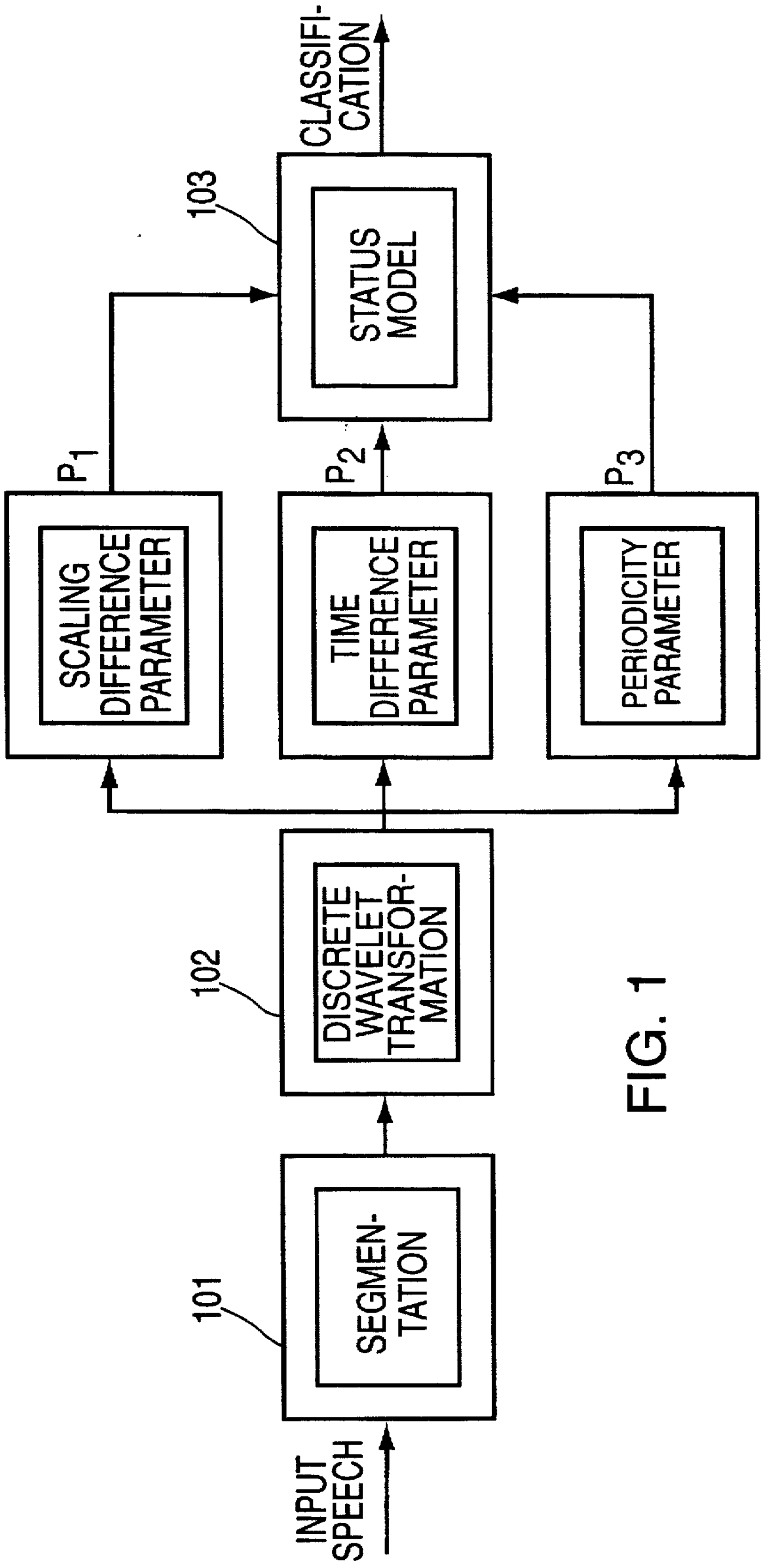
FIG. 1 shows a schematic of the classifier of the present invention.

The invention is described below using an exemplary embodiment. The schematic of a classifier illustrated in FIG. 1 should be used for the description of the method. 101 shows a segmentator, 102 a wavelet processor, and 103 a finite-state model processor. The speech signal is first segmented; it is divided into constant-length segments of between 5 ms and 40 ms. One of three techniques can be used to avoid edge effects in the subsequent transformation:

mirroring the segment at the boundaries;

calculating the wavelet transformation in smaller intervals (L/2, N-L/2), and frame shifting by a constant offset L/2 only, so that the segments overlap. Here L is the length of a wavelet centered on the time origin, and the condition N>L applies.

filling the edges of the segment with previous or future sampling values.

A discrete wavelet transformation follows. For such a segment s(k), a time-discrete wavelet transformation (DWT) $S_h(m,n)$ is calculated in relation to a wavelet h(k) with the integer scaling (m) and time shift (n) parameters. This transformation is defined by $$S_h(m,n) = \sum_{k=N_u}^{N_0} s(k) h^* \left( \frac{k - n a_0^m}{a_0^m} \right)$$

where $N_u$ and $N_o$ represent the lower and upper limits, respectively, of time index k, defined by the selected segmentation. The transformation must now be calculated only for the scaling range 0<m<M and the time range in the interval (0,N), with constant M selected so in relation to $a_o$, that the lowest signal frequencies in the transformation interval are still sufficiently well represented.

In order to classify speech signals, it is usually sufficient to subject the signal to dyadic scaling ($a_o$=2). If wavelet h(k) can be represented through a "multiresolution analysis" according to Rioul, Vetterli through an iterated filter array, the efficient recursive algorithms described in the literature can be used for calculating the dyadic wavelet transformation. In this case ($a_o$=2), a breakdown to a maximum of M=6 is sufficient. Wavelets with few significant oscillation cycles but still smooth function curves are especially well suited for classification. For example, cubic spline wavelets or short orthogonal Daubechies wavelets can be used.

Classification is performed as follows. The speech segment is classified into categories on the basis of the transformation coefficients. In order to achieve as fine a time resolution as possible, the segment is further divided into P subframes, so that a classification result is output for each subframe. For use in low-bit-rate speech coding processes, the following classes are distinguished:

(1) Background noises/voiceless, (2) Signal transitions/"voicing onsets,"

(3) Periodic/voiced.

In certain coding procedures it can be useful to further divide the periodic classes, for example, into segments with predominantly low-frequency energy or with uniformly distributed energy. Therefore, optionally more than three classes can also be distinguished.

Subsequently, the parameters are calculated in a suitable processor. One set of parameters is first determined from the transformation coefficients $S_n(m,n)$, and subsequently the final classification is performed with the help of these coefficients. The selection of scaling difference ($P_1$), time difference ($P_2$), and periodicity ($P_3$) parameters has proved especially advantageous, since they have a direct relationship to the classes defined as (1) through (3).

For $P_1$, the variance of the energy of the DWT transformation coefficients is calculated over all scaling ranges. On the basis of this parameter, it can be determined for each frame, i.e., for a relatively rough time grid, whether the speech signal is voiceless or there is only background noise.

In order to obtain $P_2$, the mean energy difference of the transformation coefficients between the current and the previous frame is calculated. Then the energy differences between adjacent subframes are calculated for transformation coefficients of the fine scaling steps (m is small) and compared to the energy difference for the entire frame. Thus a measure for the probability of a signal transition (e.g., voiceless to voiced) can be determined for each subframe, i.e., for a fine time grid.

For $P_3$, the local maximums of transformation coefficients of the rough scaling steps (m is close to M) are calculated by frame, and it is checked whether these occur in regular intervals. The peaks exceeding a certain percentage T of the global maximum are designated as local maximums.

The threshold values required for these parameter calculations are adaptively controlled as a function of the current background noise level, thereby increasing the sturdiness of the method in a noisy environment.

Analysis is performed as follows. The three parameters are supplied to the analyzer in the form of "probabilities" (values represented in the interval (0,1)). The analyzer determines the final classification result for each subframe on the basis of a finite-state model. Thus the memory of the decisions made for previous subframes is taken into account. In addition, non- plausible transitions, such as a direct jump from "voiceless" to "voiced" are prohibited. Finally, a vector with P components containing the classification result for the P subframes is output for each frame.

Figure 2A:
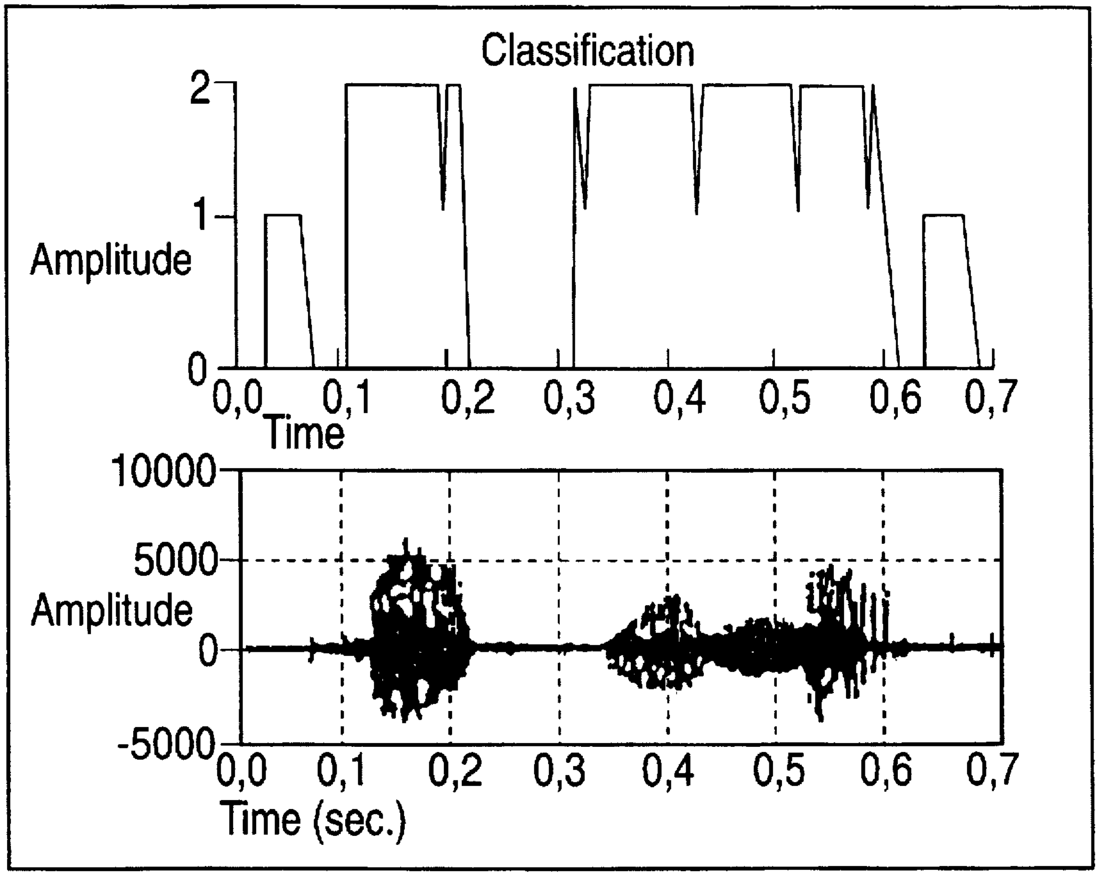
FIG. 2*a* shows classification results for the speech segment " . . . parcel, I'd like . . . " of an English-speaking female voice where telephone band speech (200 Hz to 3400 Hz) without noise was used.
Figure 2B:
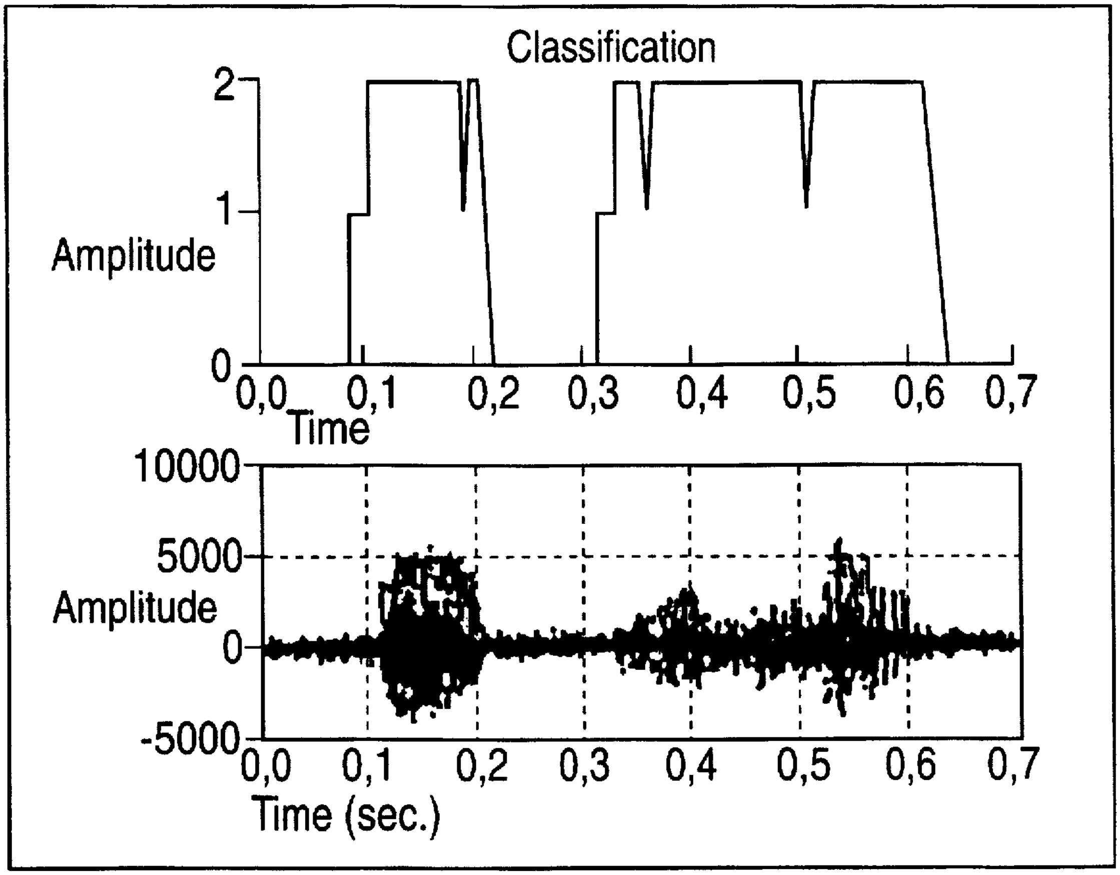
FIG. 2*b* shows classification results for the speech segment " . . . parcel, I'd like . . . " of an English-speaking female voice where vehicular noise with an average signal-to-noise ratio of 10 dB was also superimposed.

FIGS. 2*a* and 2*b* show the classification results for the speech segment " . . . parcel, I'd like . . . " of an English-speaking female voice as an example. The 20-ms-long speech segments are here subdivided into four equidistant subframes of 5 ms each. The DWT was obtained only for dyadic scaling steps and on the basis of cubic spline wavelets with the help of a recursive filter array. The three signal classes are designated as 0, 1, 2 in the same sequence as above. For FIG. 2*a*, telephone band speech (200 Hz to 3400 Hz) without noise was used, while for FIG. 2*b* vehicular noise with an average signal-to-noise ratio of 10 dB was also superimposed. A comparison of the two figures shows that the classification result is almost independent of the noise level. With the exception of small differences, which are irrelevant for speech coding applications, the perceptually important periodic segments, as well as their start and end points are well located in both cases. Evaluation of a large variety of different speech materials has shown that the classification error is clearly less than 5% for signal-noise differences greater than 10 dB.

The classifier was also tested for the following typical applications: A CELP coding method operates with a frame length of 20 ms and divides this frame into four subframes of 5 ms each for efficient excitation coding. A matched combination of code books is used for each subframe according to the above-mentioned three signal classes on the basis of the classifier. A typical code book with 9 bits/subframe is used for each class to code the excitation, resulting in a bit rate of only 1800 bps for the excitation coding (without gain). A Gaussian code book was used for the voiceless class, a two-pulse code book for the onset class, and an adaptive code book for the periodic class. Even for this simple configuration of code books working with fixed subframe lengths, a clearly understandable speech quality was obtained, although sounding somewhat rough in the periodic segments. We shall mention for the sake of comparison that in ITU-T, Study Group 15 Contribution-Q. 12/15 Draft Recommendation G.729- Coding of Speech at 8 kbs Using Conjugate-Structure-Algebraic-Code-Excited-Linear-Predictive (CS-ACELP) Coding, 1995, for excitation coding (without gain), 4800 bps were required in order to achieve line quality. Even in Gerson, I. et al., Speech and Channel Coding for the Half-Rate GSM Channel, ITG report "Codierung fuir Quelle, Kanal und Übertragung" (Coding for Source, Channel, and Transmission), 1994, 2800 bps were still used in order to obtain mobile telephone quality.

Segmentator 101, wavelet processor 102 and finite-state model processor 103 all may be located within a single microprocessor.

What is claimed is:

1. A method for classifying speech signals comprising the steps of:

segmenting the speech signal into frames;

calculating a wavelet transformation;

obtaining a set of parameters ($P_1$–$P_3$) from the wavelet transformation;

dividing the frames into subframes using a finite-state model which is a function of the set of parameters;

classifying each of the subframes into one of a plurality of speech coding classes.

2. The method as recited in claim 1 wherein the speech signal is segmented into constant-length frames.

3. The method as recited in claim 1 wherein at least one frame is mirrored at its boundaries.

4. The method as recited in claim 1 wherein the wavelet transformation is calculated in smaller intervals, and the frame is shifted by a constant offset.

5. The method as recited in claim 1 wherein an edge of at least one frame is filled with previous or future sampling values.

6. The method as recited in claim 1 wherein for a certain frame s(k), a time-discrete wavelet transformation $S_h(m,n)$ is calculated in reference to a certain wavelet h(k) with integer scaling (m) and time shift (n) parameters.

7. The method as recited in claim 6 wherein the set of parameters are scaling difference ($P_1$), time difference ($P_2$), and periodicity ($P_3$) parameters.

8. The method as recited in claim 7 wherein the set of parameters are determined from the transformation coefficients of $S_h(m, n)$.

9. The method as recited in claim 1 wherein the set of parameters is obtained with the help of adaptive thresholds, threshold values required for obtaining the set of parameters being adaptively controlled according to a current level of background noise.

10. A method for classifying speech signals comprising the steps of:

segmenting the speech signal into frames;

calculating a wavelet transformation;

obtaining a set of parameters ($P_1$–$P_3$) from the wavelet transformation;

dividing the frames into subframes based on the set of parameters, so that the subframes are classified as either voiceless, voicing onsets, or voiced.

11. A speech classifier comprising:

a segmentator for segmenting input speech to produce frames;

a wavelet processor for calculating a discrete wavelet transformation for each segment and determining a set of parameters ($P_1$–$P_3$) with the help of adaptive thresholds; and a finite-state model processor, which receives the set of parameters as inputs and in turn divides the speech frames into subframes and classifies each of these subframes into one of a plurality of speech coding classes.

* * * * *